United States Patent
Simin et al.

(10) Patent No.: US 10,002,862 B2
(45) Date of Patent: Jun. 19, 2018

(54) SOLID-STATE LIGHTING STRUCTURE WITH INTEGRATED SHORT-CIRCUIT PROTECTION

(71) Applicant: Sensor Electronic Technology, Inc., Columbia, SC (US)

(72) Inventors: Grigory Simin, Columbia, SC (US); Michael Shur, Latham, NY (US)

(73) Assignee: Sensor Electronic Technology, Inc., Columbia, SC (US)

( * ) Notice: Subject to any disclaimer, the term of this patent is extended or adjusted under 35 U.S.C. 154(b) by 0 days. days.

(21) Appl. No.: 15/263,716

(22) Filed: Sep. 13, 2016

(65) Prior Publication Data

US 2017/0077085 A1   Mar. 16, 2017

Related U.S. Application Data

(60) Provisional application No. 62/218,041, filed on Sep. 14, 2015.

(51) Int. Cl.
| | | |
|---|---|---|
| *H01L 23/00* | (2006.01) |
| *H01L 27/02* | (2006.01) |
| *H01L 25/16* | (2006.01) |
| *H01L 23/62* | (2006.01) |

(52) U.S. Cl.
CPC .......... *H01L 27/0266* (2013.01); *H01L 23/62* (2013.01); *H01L 25/167* (2013.01)

(58) Field of Classification Search
CPC .................................................. H01L 27/0266
See application file for complete search history.

(56) References Cited

U.S. PATENT DOCUMENTS

| 5,003,357 A | * | 3/1991 | Kim ..................... H01L 25/167 |
| | | | 257/622 |
| 7,154,149 B2 | | 12/2006 | Wu et al. |
| 2012/0194077 A1 | | 8/2012 | Wei et al. |
| 2014/0191249 A1 | * | 7/2014 | Blanchard ............ H01L 27/153 |
| | | | 257/77 |

FOREIGN PATENT DOCUMENTS

| JP | 2002079707 A | 3/2002 |
| JP | 2005129691 A | 5/2005 |
| JP | 2008016700 A | 1/2008 |
| JP | 2008047767 A | 2/2008 |
| JP | 5312711 A | 7/2013 |

OTHER PUBLICATIONS

International Application No. PCT/US2016/051564, International Search Report and Written Opinion, dated Dec. 26, 2016, 9 pages.

* cited by examiner

*Primary Examiner* — William Harriston
(74) *Attorney, Agent, or Firm* — Labatt, LLC

(57) ABSTRACT

A solid-state light source (SSLS) with an integrated short-circuit protection approach is described. A device can include a SSLS having an n-type semiconductor layer, a p-type semiconductor layer and a light generating structure formed there between. A field-effect transistor (FET) can be monolithically connected in series with the SSLS. The FET can have a saturation current that is greater than the normal operating current of the SSLS and less than a predetermined protection current threshold specified to protect the SSLS and the FET.

20 Claims, 12 Drawing Sheets

SOLID-STATE LIGHTING STRUCTURE WITH INTEGRATED SHORT-CIRCUIT PROTECTION

REFERENCE TO RELATED APPLICATIONS

The present patent application claims the benefit of U.S. Provisional Application No. 62/218,041, which was filed on 14 Sep. 2015, and which is hereby incorporated by reference.

TECHNICAL FIELD

The present invention relates generally to solid-state lighting, and more particularly, to solid-state lighting structures (SSLSs), such as light emitting diodes (LEDs) and lasers, with integrated short circuit protection.

BACKGROUND ART

A great deal of interest has been focused on SSLSs, such as LEDs and lasers, and in particular, those that emit light in the blue and deep ultraviolet (UV) wavelengths. These devices may be capable of being incorporated into various applications, including solid-state lighting, biochemical detection, high-density data storage, and the like.

A modern SSLS such as an LED typically includes three major components: an electron supply layer (e.g., an n-type semiconductor layer), a hole supply layer (e.g., a p-type semiconductor layer), and a light generating structure formed between the electron supply layer and the hole supply layer. Nitride-based SSLSs typically have a relatively high defect concentration and operate at a high current density level. Failures of devices that include SSLSs generally occur as a result of these factors. These device failures that occur typically lead to the SSLSs forming a short-circuit path. High current flowing through a short-circuit path can cause propagating failures such as power supply or driver failures.

A high-power SSLS-based lamp assembly of LEDs is another type of SSLS device where failures can arise. Typically, high-power SSLS-based lamp assemblies often have multi-pixel structures where multiple small-area devices operate in parallel. In these small-area devices, the failure of a single pixel (i.e., an elementary SSLS) does not cause significant total power degradation, however, the related failures of the SSLS drivers and/or power supplies can cause the failure of the entire high-power lamp.

To address these failure issues associated with the various types of SSLSs, approaches have been deployed that rely on using circuits containing fuses connected in series with the SSLSs. Typically, these fuses are made from materials with low melting temperatures and/or with positive temperature coefficients of resistance. Thus, when a short-circuit failure occurs, the current through the SSLS increases as does the current through the fuse. This leads to the fuse melting and consequently disconnecting the defective device. However, the fuse melting is a relatively slow process before it can trigger the current off. As a result, sequential damage can still occur despite the protection provided by the fuse. Furthermore, the damage can be exacerbated by parasitic capacitances and inductors located between the fuse and the SSLS that may further slowdown the protection time and also lead to high current spikes caused by the short-circuit.

Electro-static discharge (ESD) protection is another type of protection measure that can be used with various types of SSLSs. One ESD protection approach involves using ESD protection elements connected in parallel with a SSLS. However, the parallel connection of the ESD protection elements are typically ineffective in protecting a system from short-circuit type failures because this type of protection does not remove the excessive voltage from being applied to the protected SSLS.

SUMMARY OF THE INVENTION

This summary of the invention introduces a selection of certain concepts in a brief form that are further described below in the detailed description of the invention. It is not intended to exclusively identify key features or essential features of the claimed subject matter set forth in the claims, nor is it intended as an aid in determining the scope of the claimed subject matter.

Aspects of the present invention can obviate one or more of the shortcomings associated with the aforementioned approaches of providing short-circuit protection of a SSLS. In one embodiment, a device can include a SSLS having an n-type semiconductor layer, a p-type semiconductor layer and a light generating structure formed between the n-type semiconductor layer and the p-type semiconductor layer. A field-effect transistor (FET) can be monolithically connected in series with the SSLS to provide integrated short-circuit protection. In one embodiment, the FET can be configured to have a FET resistance in a linear regime that is less than the static resistance of the SSLS under a normal operating current. In this manner, the FET will have only a minor degradation of the SSLS under normal operating conditions. The FET can also be configured to have a saturation current in a saturation regime (i.e., a protection mode) that is greater than the operating current of the SSLS, but lower than a predetermined protection threshold specified to ensure overall system protection. Thus, if a short-circuit occurs in the SSLS, the FET current will saturate and ensure that the SSLS operating current is kept smaller than the FET saturation current and prevent a system failure.

In one embodiment, the FET can be fabricated from materials with a high mobility of free carriers. In this manner, the free carriers can go from the linear region into the saturation region within a very short time; typically in a nanosecond or even a sub-nanosecond range. This ultrafast switching of the FET from the linear region to the saturation region ensures reliable protection of the entire system. Having the FET integrated or monolithically connected in series with the SSLS also can eliminate parasitic inductive, capacitive or resistive elements that would normally hinder such an ultrafast switch.

In another embodiment, a fuse element, such as a thin-film fuse element can be connected in series to the FET to further facilitate the protection of the SSLS. For example, the power dissipated in the fuse element can be significantly below its meltdown threshold to disconnect the SSLS. In this manner, when a short-circuit occurs, the SSLS operating current increases instantly up to the level of the FET saturation current and the power dissipated in the fuse element increases significantly. This causes it to meltdown, and thus, disconnect the SSLS from the system. The time needed for a fuse meltdown can be in a microsecond or even a sub-microsecond range. In this manner, the combination of an integrated protection FET with a thin film fuse element provides two-steps of protection. The first step ensures that the SSLS operating current is less than the FET saturation current to prevent the formation of a short-circuit, and the second step includes having the fuse element meltdown and disconnect the SSLS to prevent any system damage from excessive current.

In one embodiment, a system can be formed from a set of SSLSs and a set of FETs, with each FET monolithically connected in series with one of the SSLSs, and a set of fuse elements, with each fuse element connected in series to one of the FETS. In one approach, each coupled SSLS, FET and fuse element can be connected in parallel to the other coupled SSLSs, FETs, and fuse elements. In another approach, some of the SSLSs, FETs and fuse elements can be connected in parallel to the other coupled SSLSs, FETs, and fuse elements.

A first aspect of the invention provides a device, comprising: a solid-state lighting structure (SSLS) including an n-type semiconductor layer, a p-type semiconductor layer and a light generating structure formed between the n-type semiconductor layer and the p-type semiconductor layer; and a field-effect transistor (FET) monolithically connected in series with the SSLS.

A second aspect of the invention provides a device, comprising: a plurality of light emitting circuits connected in parallel, each of the plurality of light emitting circuits including: a solid-state lighting structure (SSLS), including an n-type semiconductor layer, a p-type semiconductor layer and a light generating structure formed between the n-type semiconductor layer and the p-type semiconductor layer; a field-effect transistor (FET) monolithically connected in series with the SSLS; and a fuse element connected in series to the FET.

A third aspect of the invention provides a method, comprising: fabricating a solid state light source (SSLS) with integrated short-circuit protection, wherein the SSLS with integrated short-circuit protection comprises: a solid-state lighting structure (SSLS) including an n-type semiconductor layer, a p-type semiconductor layer and a light generating structure formed between the n-type semiconductor layer and the p-type semiconductor layer; and a field-effect transistor (FET) monolithically connected in series with the SSLS.

A fourth aspect of the invention provides a system, comprising: an object; a radiation source configured to direct radiation onto the object, the radiation source including: a set of solid-state lighting structures (SSLSs), each including an n-type semiconductor layer, a p-type semiconductor layer and a light generating structure formed between the n-type semiconductor layer and the p-type semiconductor layer; a set of field-effect transistors (FETs), each monolithically connected in series with one of the set of SSLSs; a set of fuse elements, each fuse element connected to one of the FETS connected in series with one of the SSLSs; a set of radiation detectors configured to detect an amount of radiation directed to the object by the radiation source, each radiation detector configured to detect an intensity of radiation and generate a signal representative thereof; and a monitoring unit configured to receive the signals representative of the intensity of radiation detected by the set of radiation detectors and monitor the intensity of radiation directed at the object, the monitoring unit configured to control an amount of radiation generated from the radiation source towards the object as a function of the intensity of radiation signals.

The illustrative aspects of the invention are designed to solve one or more of the problems herein described and/or one or more other problems not discussed.

BRIEF DESCRIPTION OF THE DRAWINGS

These and other features of the disclosure will be more readily understood from the following detailed description of the various aspects of the present invention taken in conjunction with the accompanying drawings that depict various aspects of the invention.

It is noted that the drawings may not be to scale. The drawings are intended to depict only typical aspects of the invention, and therefore should not be considered as limiting the scope of the invention. In the drawings, like numbering represents like elements between the drawings.

DETAILED DESCRIPTION OF THE INVENTION

Figure 1A:
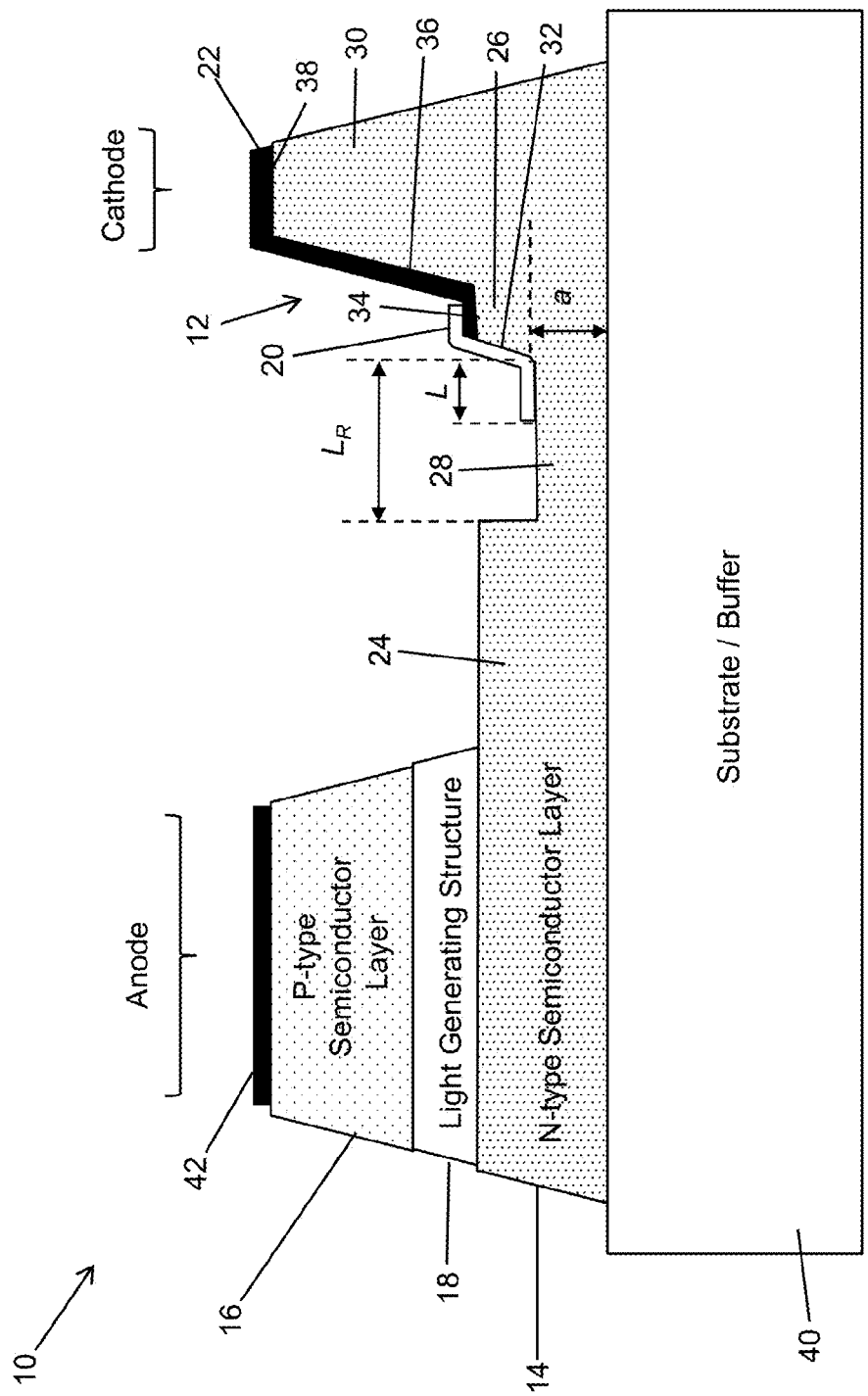
FIGS. 1A-1B show side and top views of a schematic of a SSLS with an integrated protection FET according to one embodiment.

The various embodiments are directed to SSLSs with integrated short-circuit protection. In one embodiment, a FET can be monolithically connected in series with a SSLS to provide the short-circuit protection. The FET can provide the short-circuit protection by having a saturation current in a saturation regime that is greater than the operating current of the SSLS, but lower than a predetermined protection threshold specified to ensure overall system protection. If a short-circuit occurs in the SSLS, then the FET current will saturate, ensuring that the SSLS operating current is kept smaller than the FET saturation current and never rise to a level will lead to system failure. In another embodiment, a fuse element, such as a thin-film fuse element, can be connected in series to the FET to further facilitate the protection of the SSLS from a short-circuit. When a short-circuit occurs, the SSLS operating current increases instantly up to the level of the FET saturation current and the power dissipated in the fuse element increases significantly. This causes the fuse element to meltdown and disconnect the SSLS from the system. In this manner, ensuring that the SSLS operating current is less than the FET saturation current prevents the formation of a short-circuit and disconnecting the SSLS upon the fuse element meltdown prevents any system damage from excessive current. In another embodiment, a system can be formed from a set of SSLSs and a set of FETs, with each FET monolithically connected in series with one of the SSLSs, and a set of fuse elements, with each fuse element connected in series to one of the FETS. Other embodiments can include methods of fabricating devices and systems that include the SSLSs, FETs, with and without the fuse elements.

As used herein, a SSLS includes any diode that, under normal operating conditions, operates in a forward-bias mode. The SSLS can include of a multitude of SSLSs such as for example, a p-n junction SSLS, a multiple-quantum well SSLS and a heterojunction SSLS. In one embodiment, the SSLS can include any type of semiconductor LED such as conventional and super luminescent LEDs, light emitting solid state lasers, laser diodes of various types, and/or the like. These examples of SSLSs can be configured to emit electromagnetic radiation from a light generating structure such as an active region upon application of a bias. The electromagnetic radiation emitted by these SSLSs can comprise a peak wavelength within any range of wavelengths, including visible light, ultraviolet radiation, deep ultraviolet radiation, infrared light, and/or the like. For example, these SSLSs can emit radiation having a dominant wavelength within the ultraviolet range of wavelengths. As an illustration, the dominant wavelength can be within a range of wavelengths of approximately 210 nanometers (nm) to approximately 350 nm.

Any of the various layers that form the SSLSs can be considered to be transparent to radiation of a particular wavelength when the layer allows an amount of the radiation radiated at a normal incidence to an interface of the layer to pass there through. For example, a layer can be configured to be transparent to a range of radiation wavelengths corresponding to a peak emission wavelength for light, such as ultraviolet light or deep ultraviolet light, emitted by the SSLS (e.g., peak emission wavelength+/−five nanometers). As used herein, a layer is transparent to radiation if it allows more than approximately five percent of the radiation to pass there through, while a layer can also be considered to be transparent to radiation if it allows more than approximately ten percent of the radiation to pass there through. Defining a layer to be transparent to radiation in this manner is intended to cover layers that are considered transparent and semi-transparent.

A layer of the SSLS can be considered to be reflective when the layer reflects at least a portion of the relevant electromagnetic radiation (e.g., light having wavelengths close to the peak emission of the light generating structure). As used herein, a layer is partially reflective to radiation if it can reflect at least approximately five percent of the radiation, while a layer can also be considered to be partially reflective if it reflects at least thirty percent for radiation of the particular wavelength radiated normally to the surface of the layer. A layer can be considered highly reflective to radiation if it reflects at least seventy percent for radiation of the particular wavelength radiated normally to the surface of the layer.

The description that follows may use other terminology herein for the purpose of describing particular embodiments only and is not intended to be limiting of the disclosure. For example, unless otherwise noted, the term "set" means one or more (i.e., at least one) and the phrase "any solution" means any now known or later developed solution. The singular forms "a," "an," and "the" are intended to include the plural forms as well, unless the context clearly indicates otherwise. It will be further understood that the terms "comprises", "comprising", "includes", "including", "has", "have", and "having" when used in this specification, specify the presence of stated features, integers, steps, operations, elements, and/or components, but do not preclude the presence or addition of one or more other features, integers, steps, operations, elements, components, and/or groups thereof.

Figure 1B:
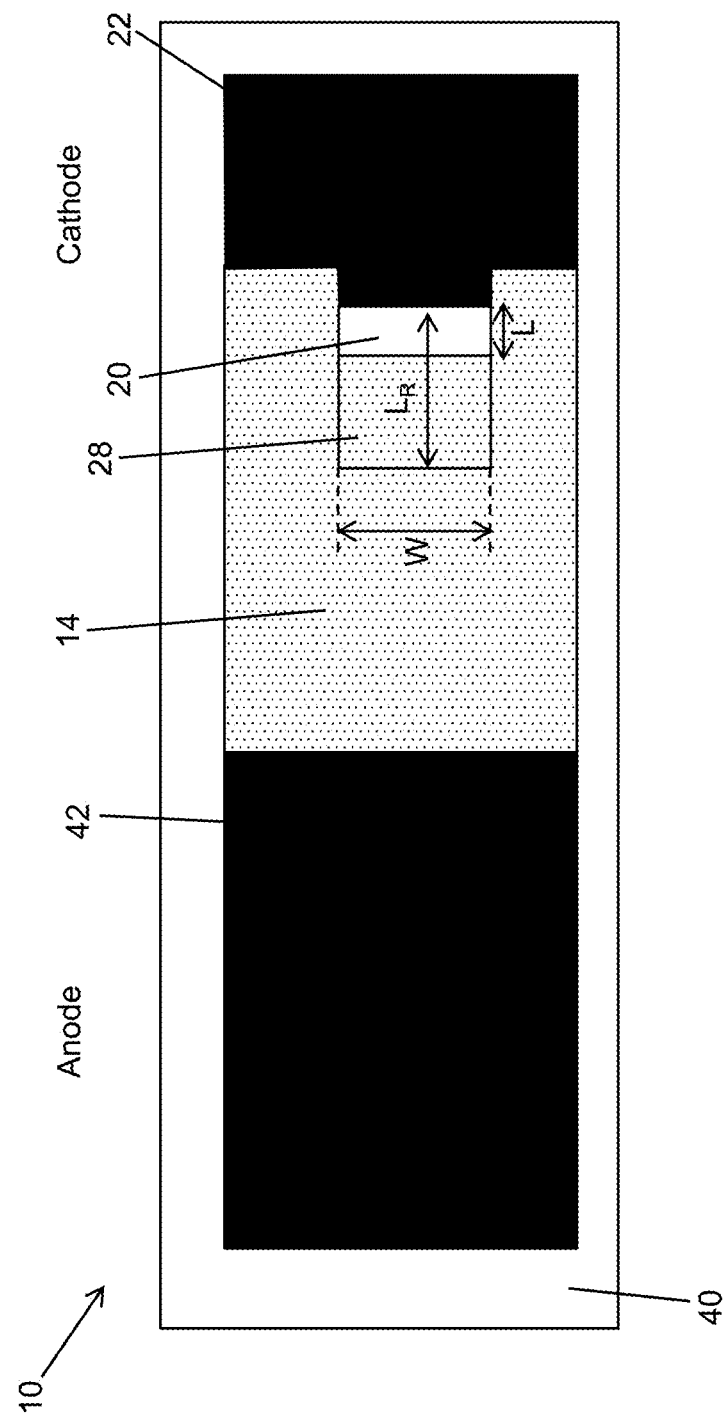

Turning to the drawings, FIGS. 1A-1B show side and top views of a schematic of a SSLS 10 with an integrated protection FET 12 according to one embodiment. As shown in the cross-sectional view of FIG. 1A, the SSLS 10 can include a n-type semiconductor layer 14 (e.g., an electron supply layer), a p-type semiconductor layer 16 (e.g., a hole supply layer) and a light generating structure 18 (e.g. a multi-quantum well) formed between the n-type semiconductor layer and the p-type semiconductor layer. A channel a of the FET 12 can be monolithically connected in series with the SSLS 10. In one embodiment, the FET 12 can be integrated with the n-type semiconductor layer 14. As shown FIG. 1A, the FET 12 can include a gate electrode 20 having a gate length L and a source electrode 22. A drain region of the FET 12 can correspond to regions 24, 28 of the n-type semiconductor layer 14. In this embodiment, a drain electrode is not needed as the drain region can be connected directly to a n-region of the SSLS p-n junction. Additionally, the drain region (or a drain electrode, when included) is connected to the cathode side of the SLSS. In this manner, the drain region of the FET channel a can be monolithically integrated with the n-type semiconductor layer 18 forming the cathode side of the SSLS 10. The gate electrode 20 of the FET 12 can be of any type (e.g., Schottky, MOS, heterojunction, etc.).

FIG. 1A shows that the n-type semiconductor layer 14 can include a first horizontally extending region 24, a second horizontally extending region 26, a recessed region 28 having a recess length $L_R$ formed between the first horizontally extending region 24 and the second horizontally extending region 26, and an elevated region 30 extending upward from the second horizontally extending region 26. The gate electrode 20 of the FET 12 can be formed on a portion of a surface of the recessed region 28. The gate electrode 20 can extend along the surface of the recessed region 28 up against a sidewall 32 forming the recessed region. FIG. 1A further shows that the gate electrode 20 can extend upward along the sidewall 32 over a surface 34 of the second horizontally extending region 26. The source electrode 22 can extend along the surface 34 of the second horizontally extending region 26 up against a sidewall 36 of the elevated region 30. The source electrode 22 can extend upward along the sidewall 36 of the elevated region 30 onto a surface 38 of the elevated region. The top view of FIG. 1B shows that the gate electrode 20 connects with the source electrode 22 on the surface 34 of the second horizontally extending region 26. Although not shown in FIGS. 1A-1B, the source electrode 22 can be connected to a power supply or other external circuit elements. For example, in one embodiment, the source electrode 22 can be connected to a negative terminal of the power supply.

For clarity, the SSLS 10 and the integrated FET 12 can be formed on a substrate/buffer 40. The substrate/buffer 40 is illustrated in FIGS. 1A-1B as one element, however, it is understood that the substrate and buffer can comprise separate elements. In one embodiment, the SSLS 10 and the FET 12 can be formed on the buffer layer, which can be formed on the substrate. In one embodiment, the substrate can include sapphire, silicon carbide (SiC), silicon (Si), GaN, AlGaN, AlON, LiGaO$_2$, or another suitable material, and the buffer layer can include AlN, an AlGaN/AlN superlattice, and/or the like. In one embodiment, the substrate can include a non-conductive or insulating substrate. Examples of non-conductive or insulating substrate can include highly-resistive silicon, insulating SiC, sapphire, diamond, a dielectric material, organic materials, and/or the like.

In the schematic depicted in FIGS. 1A-1B, an anode and a cathode can be formed from the aforementioned configuration of the SSLS 10 and the FET 12. In one embodiment, the anode can include the p-type semiconductor layer 16, the light generating structure 18, a portion of the first horizontally extending region 24, and an anode electrode 42 formed over the p-type semiconductor layer 16, while the cathode can include the source electrode 22 of the FET 12 and the second horizontally extending region 26 and the elevated region 30 of the n-type semiconductor layer 14.

The SSLS 10 and the FET 12 can form a group III-V materials based-device, in which some or all of the various layers are formed of elements selected from the group III-V materials system. In a more particular illustrative embodiment, the various layers of the SSLS 10 and the FET 12 can be formed of group III nitride based materials. Group III nitride materials comprise one or more group III elements (e.g., boron (B), aluminum (Al), gallium (Ga), and indium (In)) and nitrogen (N), such that $B_W Al_X Ga_Y In_Z N$, where $0 \le W, X, Y, Z \le 1$, and $W+X+Y+Z=1$. Illustrative group III nitride materials can include binary, ternary and quaternary alloys such as, AlN, GaN, InN, GaAs, GaInP, BN, AlGaN, AlInGaN, AlInN, AlBN, AlGaInN, AlGaBN, AlInBN, and AlGaInBN with any molar fraction of group III elements.

An illustrative embodiment of a group III nitride based light generating structure 18 that includes a multi-quantum well (e.g., a series of alternating quantum wells and barriers) can comprise $In_y Al_x Ga_{1-x-y} N$, $Ga_z In_y Al_x B_{1-x-y-z} N$, an $Al_x Ga_{1-x} N$ semiconductor alloy, or the like. Similarly, both the n-type semiconductor layer 14 and the p-type semiconductor layer 16 and can be composed of an $In_y Al_x Ga_{1-x-y} N$ alloy, a $Ga_z In_y Al_x B_{1-x-y-z} N$ alloy, or the like. The molar fractions given by x, y, and z can vary between the various layers 14, 16, and 18.

The FET 12 can have a FET resistance in the linear regime of operation that is less than the static resistance of the SSLS 10 under normal operating current. As a result, the FET 12 will have only a minor degradation of the SSLS 10 under normal operating conditions. In order for the FET 12 to provide short-circuit protection, it can be further configured to have a saturation current in a saturation regime of operation that is greater than the operating current of the SSLS 10, but lower than a predetermined protection threshold specified to ensure overall system protection. If a short-circuit occurs in the SSLS 10, the FET current will saturate and ensure that the SSLS operating current is kept smaller than the FET saturation current and prevent a system failure. It is understood that the predetermined protection threshold will depend on the device or system in which the SSLS 10 and the FET 12 is deployed and its type of application. Thus, the selection of this protection threshold is considered to be well within the purview of those skilled in the art. Also, the saturation regime can be referred to as a protection mode of operation which functions to protect the SSLS 10 when invoked.

The inclusion of the recessed region 28 in the n-type semiconductor layer 14 of the SSLS can help in obtaining the required on-resistance and saturation current in the FET that makes it possible to provide short-circuit protection in the embodiment illustrated in FIGS. 1A-1B as well as some of the other various embodiments described herein. In particular, the recessing of the recessed region 28 aids in obtaining a suitable thickness of the FET channel a as described further herein.

As illustrated in FIG. 1B, the FET width W may be different from that of the SSLS 10. In addition, the recess length $L_R$ can be relatively small (e.g., less than twenty percent) as compared to the overall dimension of the SSLS 10 to reduce the total FET resistance $R_{ON}$. In one embodiment, the recess length $L_R$ can be larger than the gate length L. For example, the relationship between the recess length $L_R$ and the gate length L can be expressed as $L_R = (1.5 \ldots 3) L$.

In order for the FET 12 to provide the short-circuit protection described herein while introducing only minimal degradation of the wall-plug efficiency of the SSLS 10, it can be designed in the following manner. As discussed herein, the FET resistance in the linear regime can be smaller than the SSLS static resistance under normal operating current. As an illustrative example, if the SSLS operating current is $I_{OP}$ and the voltage drop across the SSLS is $V_{SSLS}$, then the SSLS static resistance is given by $R_{SSLS} = V_{SSLS}/I_{OP}$. The FET resistance in the linear regime can be designed to be $R_{ON} < R_{SSLS}$, typically $R_{ON} = (0.1 \ldots 0.3) R_{SSLS}$.

This requirement can be met by using the following FET design. It is understood that the FET can include any type of FET with a normally-on channel that is in a conducting state when no external voltage is applied to it. For illustrative purposes the FET design can be for a MESFET type device, however, it is understood that the design or variations thereof are suitable for other FET devices such as MOSFET types, JFET types, heterojunction FETs, or HEMT types.

Assuming for simplicity where the contact resistance is disregarded, the FET on-resistance in the linear regime can be expressed as follows:

$$R_{ON} = \frac{L}{q \cdot n \cdot \mu \cdot a \cdot W},$$

where n and µ are the electron concentration and mobility in the n-type semiconductor layer, q is the electron charge, a is the FET channel, L is the gate length, and W is the FET width. The requirement $R_{ON} < R_{SSLS}$ can be met by adjusting the FET parameters n, a, L and W.

In the saturation regime, the FET saturation current $I_{SAT}$ should be higher than the SSLS operating current but low enough to ensure the overall system protection. As an illustrative example, $I_{SAT} \ge 3 * I_{OP}$.

The FET saturation current can be designed as follows using a MESFET type device as an illustrative example. Again, assuming that the FET is MESFET, then the FET saturation current $I_{SAT}$ can be expressed as:

$$I_{SAT} = \frac{V_{TH}}{3R_{ON}},$$

where $V_{TH}$ is the FET threshold voltage given by:

$$V_{TH} = \frac{q \cdot n \cdot a^2}{2 \cdot \varepsilon \cdot \varepsilon_0},$$

where q is the electron charge, n is the electron concentration in the n-type semiconductor layer, a is the FET channel, $\varepsilon$ is the relative dielectric permittivity of the channel material, and $\varepsilon_0$ is the dielectric permittivity of a vacuum.

Because the FET on-resistance $R_{ON}$ and the FET saturation current $I_{SAT}$ characteristics are dependent on different device parameters, the required values of $R_{ON}$ and $I_{SAT}$ can be met simultaneously. As an illustrative design example, consider the SSLS operating at $I_{OP}$=20 mA with a forward voltage drop of $V_{SSLS}$=4 V. This results in $R_{SSLS}$=200 Ohm. In this manner, a FET which provides the protecting features can have the following parameters:

a=0.2 µm; n=$10^{18}$ cm$^{-3}$, µ=500 cm$^2$/(V×s), $\varepsilon$=9, W=50 µm, $L_R$=5 µm. For this set of parameters, the FET on-resistance $R_{ON}$=62.5 Ohm, while the FET saturation current $I_{SAT}$=214 mA. In this manner, the selected FET parameters meet the design requirements yielding $R_{ON}$=0.31×$R_{SSLS}$ and $I_{SAT}$=10.7×$I_{OP}$. At the same time, in the saturation regime or the protection regime, the FET saturation current of 214 mA is expected to be safe for the system power supply and other SSLSs that can be used to form a light-emitting system.

Figure 2:
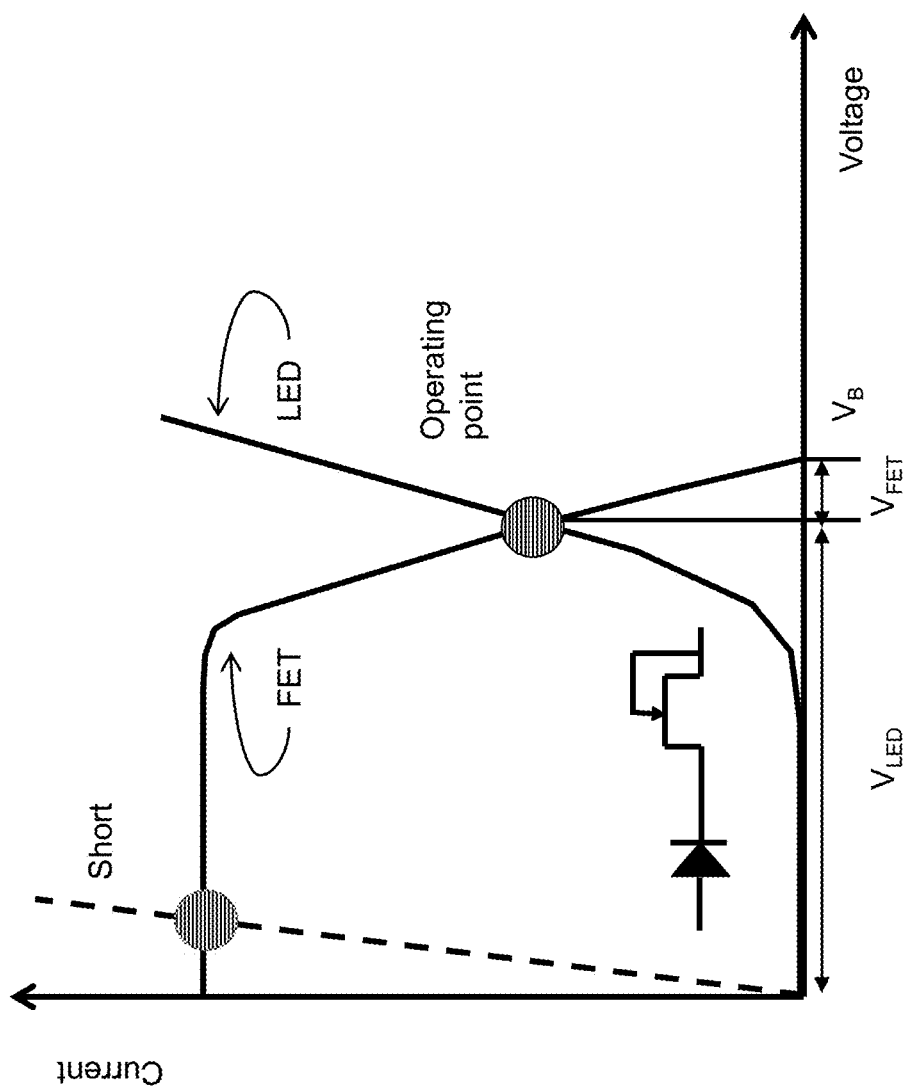
FIG. 2 shows a schematic diagram illustrating the current limiting provided by a FET integrated into and connected in series with the SSLS according to an embodiment.

FIG. 2 illustrates how a SSLS with an integrated protection FET like the one depicted in FIGS. 1A-1B, as well as the other embodiments described herein, would operate. In particular, FIG. 2 shows a schematic diagram illustrating the current limiting capability provided by a FET integrated into and connected in series with a SSLS according to an embodiment.

The FET design described herein ensures that the SSLS operating current is lower than the saturation current of the FET. Under normal operating conditions, FET operates in the linear regime and has a small resistance. The voltage drop across the FET $V_{FET}$ is a small portion of the total applied voltage $V_B$. Therefore, the connected FET causes only a minor degradation of the SSLS wall-plug efficiency. If a short occurs in the SSLS, then the SSLS resistance abruptly decreases. In the absence of protecting elements, the short-circuit SSLS would consume very high current from the power supply causing larger system failures. However, when a protection FET is connected in series with the SSLS as described herein, the FET current saturates at a level that prevents the system failure.

Having the FET fabricated from materials with high mobility of free carriers as described herein, enables the FET to go from a linear region into a saturation region within a very short time. For example, the protection FET described herein can go from the linear region into the saturation region typically in a nanosecond or even a sub-nanosecond range. This ensures reliable protection of the entire system in which the SSLS and FET are used. Such fast switching can generally only occur in the absence of parasitic connecting elements, such as wires, package parasitic elements, etc. In the various embodiments described herein, the feature of having the protection FET fully integrated monolithically into the SSLS design, completely eliminates parasitic inductive, capacitive or resistive elements.

Figure 3:
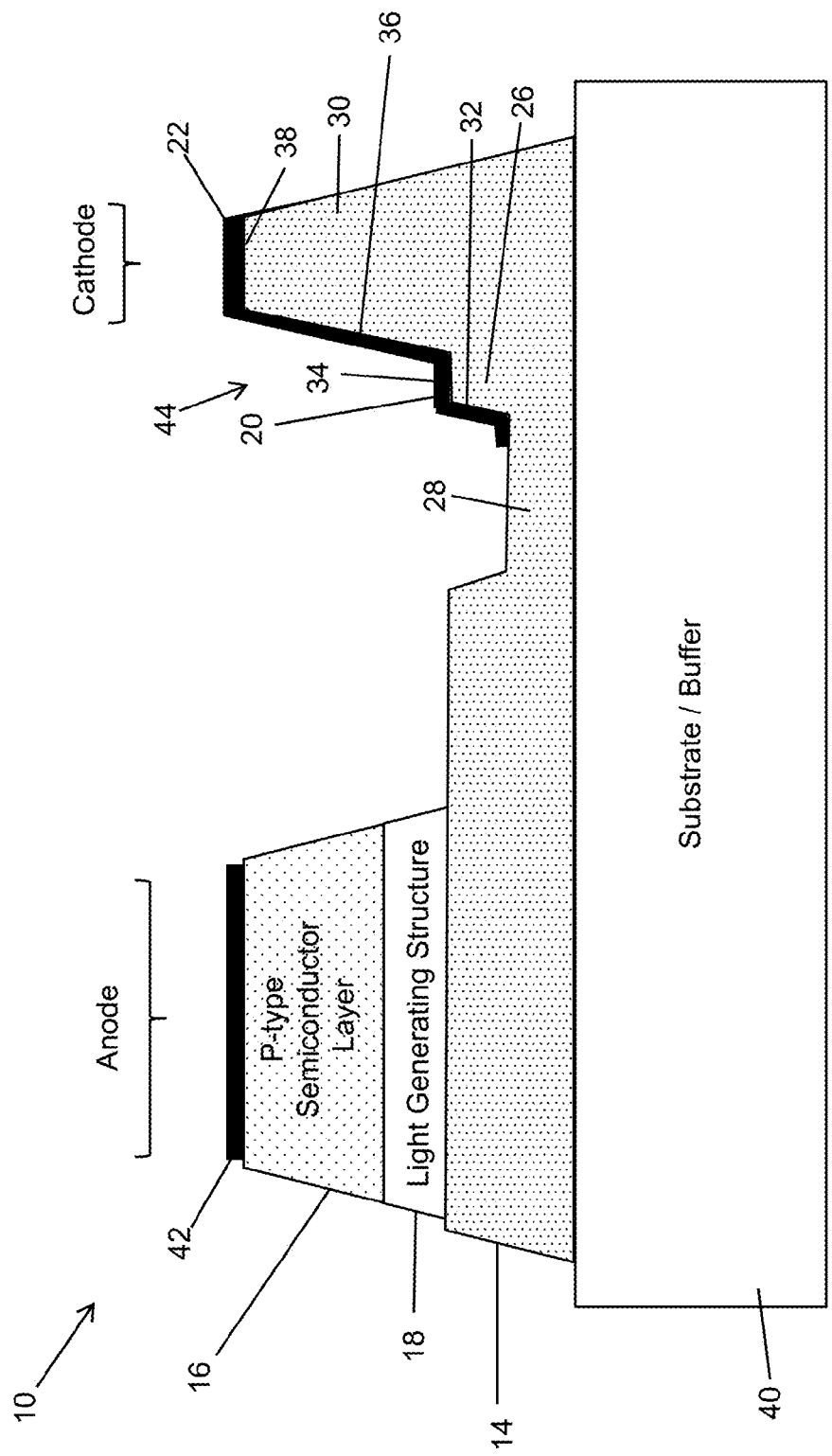
FIG. 3 shows a schematic of a SSLS integrated with and protected by a gateless FET according to an embodiment.

FIG. 3 shows a schematic of the SSLS 10 integrated with and protected by a gateless FET 44 according to an embodiment. In this embodiment, the source electrode 22 of the FET 44 can be formed on the portion of the surface of the recessed region 28. The source electrode 22 can extend along the surface of the recessed region 28 up against the sidewall 32 forming the recessed region 28. As shown in FIG. 3, the source electrode 22 can extend upward along the sidewall 32 of the recessed region 28 onto the surface 34 of the second horizontally extending region 26. The source electrode can extend along the surface 34 of the second horizontally extending region 26 up against the sidewall 36 of the elevated region 30. FIG. 3 further shows that the source electrode 22 can extend upward along the sidewall 36 of the elevated region onto the surface 38 of the elevated region 30.

In the embodiment illustrated in FIG. 3 in which the FET 44 is gateless, the current saturation of the FET can be controlled by the source electrode 22 resistance. In particular, the current $I_{SAT}$ flowing through the source electrode resistance $R_S$ creates a voltage drop across this resistance $V_S$=$I_{SAT}$×$R_S$, which is equivalent to the bias which instead could be applied to the gate electrode. In this configuration, no gate electrode deposition and alignment is needed. Additionally, the absence of gate also eliminates electric field spikes at the gate edges and increases an overall breakdown voltage of the device.

Figure 4:
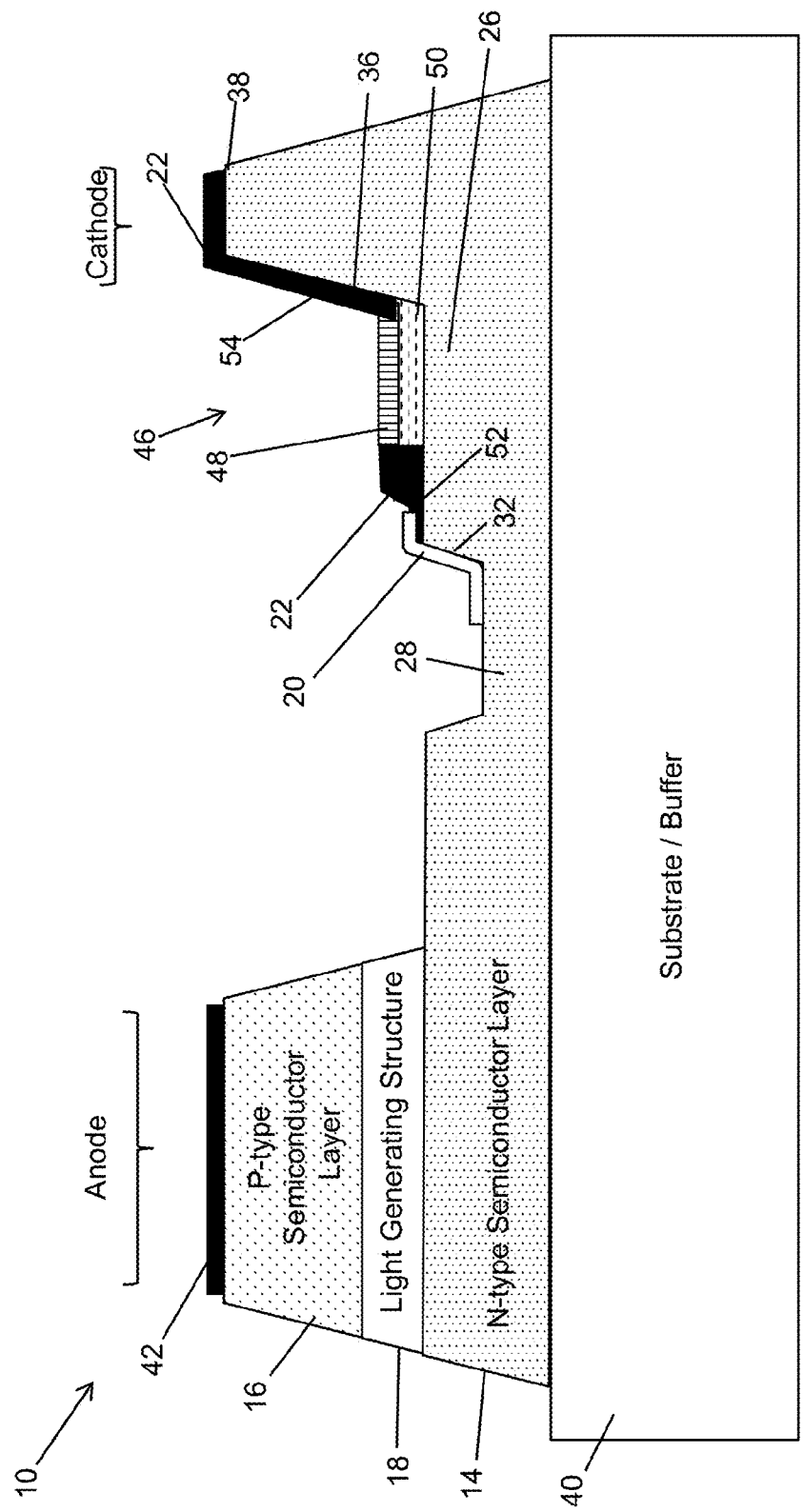
FIG. 4 shows a schematic of a SSLS with an integrated protection FET and a fuse element according to one embodiment.

FIG. 4 shows a schematic of the SSLS 10 with an integrated protection FET 46 having a fuse element 48 and a dielectric layer 50 according to one embodiment. As shown in FIG. 4, the dielectric layer 50 can be formed on the second horizontally extending region 26, and the fuse element 48 can be formed over the dielectric layer. In this embodiment, the FET 46 comprises a gate electrode 20 and a source electrode 22. The gate electrode 20 can be formed on a portion of the surface of the recessed region 28. The gate electrode 20 can extend along the surface of the recessed region 28 and up against the sidewall 32 forming the recessed region. The gate electrode 20 can extend upward along the sidewall 32 of the recessed region 28 over the surface of the second horizontally extending region 26. As shown in FIG. 4, the source electrode 22 can include a first region 52 that extends along a portion of the surface of the second horizontally extending region 26 and a second region 54 apart from the first region that extends upward along the sidewall 36 of the elevated region 30 onto the surface 38 of the elevated region. In one embodiment, the gate electrode 20 can connect with the first region 52 of the source electrode 22 on the surface of the second horizontally extending region 26.

The dielectric layer 50 can be formed along another portion of the surface of the second horizontally extending region 26. In one embodiment, a first end of the dielectric layer 50 can contact the first region 52 of the source electrode 22, and an opposing second end can contact the sidewall 36 of the elevated region and the second region 54 of the source electrode. As shown in FIG. 4, the opposing second end of the dielectric layer 50 near its top surface can contact the second region of the source electrode 22 where the source electrode extends upward along the sidewall 36 of the elevated region 30 near a bottom portion of the elevated region. The dielectric layer 50 can be formed from a multitude of materials. A non-exhaustive list of materials that are suitable for use as the dielectric layer 50 can include, but are not limited to, $SiO_2$, $Si_3N_4$, $Al_2O_3$, and/or the like.

The fuse element 48 can be connected in series to the protection FET 46. As shown in FIG. 4, in order to isolate the fuse element 48, it can be formed on the dielectric layer 50, which is formed on the n-type semiconductor layer 14 of the SSLS 10. In one embodiment, the fuse element 48 can be formed between the first region 52 and the second region 54 of the source contact 22. The fuse element 48 can include a small thin-film resistor made of a low-temperature melting material, such as Indium, and/or the like.

In operation, the fuse element 48 can be configured to undergo a meltdown in response to an operating current of the SSLS 10 attaining a saturation current of the FET. In turn, the meltdown of the fuse element 48 will lead to the disconnection of the SSLS 10. For example, consider under normal operating conditions, the SSLS current is small as in the earlier example (e.g., $I_{OP}$=20 mA) and the power dissipated in the fuse element 48 is significantly below the meltdown threshold. When a short occurs, the current increases instantly up to the level of the FET saturation current, (e.g., $I_{SAT}$=214 mA). The power dissipated in the fuse element 48 can increase by around 100 times causing the fuse meltdown, and thus disconnecting the SSLS 10. The time needed for the meltdown of the fuse element such as a thin-film fuse element is in a microsecond or even a sub-microsecond range. The combination of the integrated protection FET 46 with the fuse element 48 provides a two-step protection. That is, in case the short occurs, the current first instantly, in a sub-nanosecond time range, increases from $I_{OP}$ to $I_{SAT}$. After that, in a microsecond or sub-microsecond time range the fuse element 48 melts and completely disconnects the degraded SSLS 10 from the device or system in which it is deployed.

Figure 5:
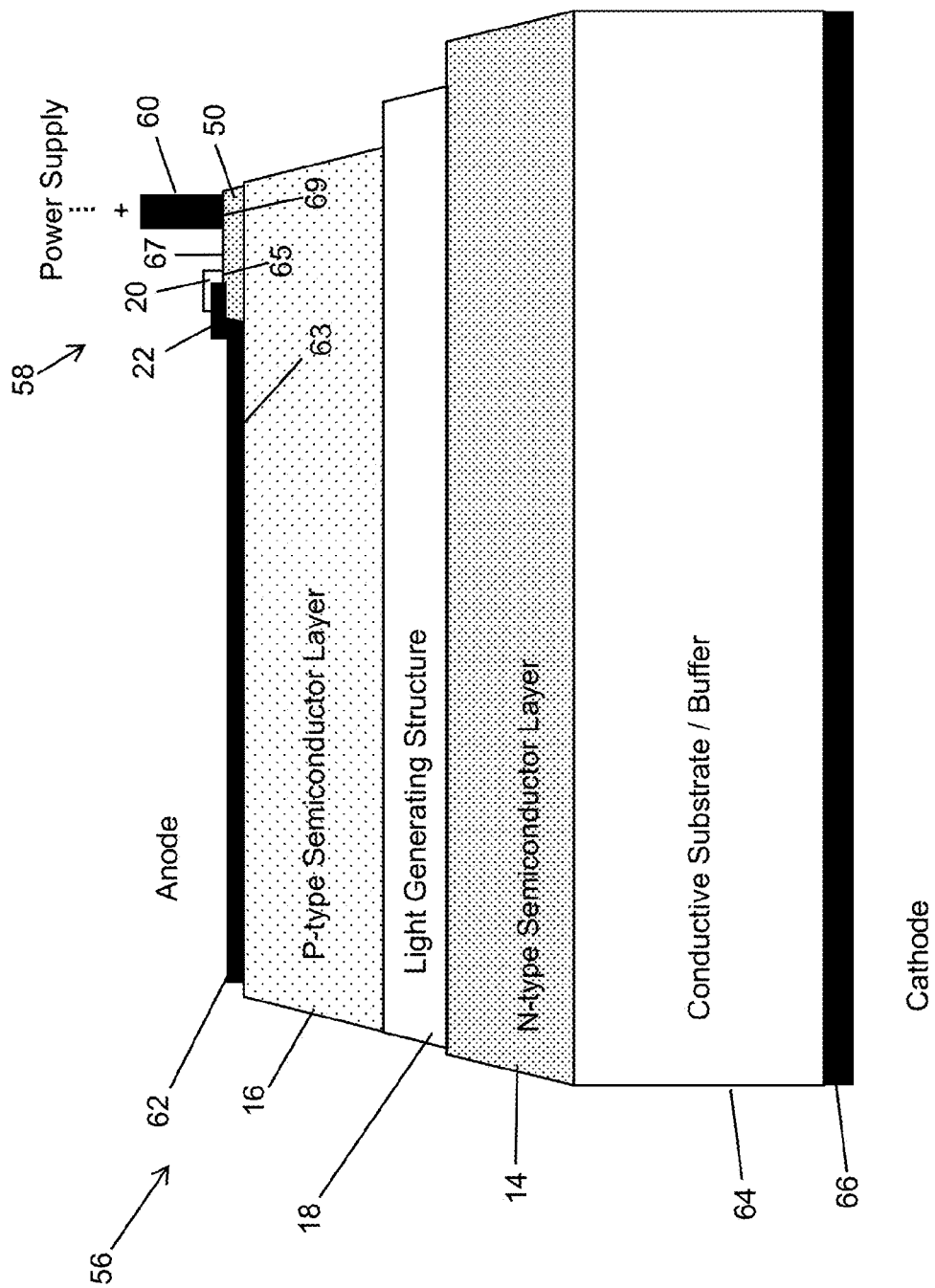
FIG. 5 shows a schematic of a SSLS with an integrated protection FET formed on a conducting substrate and wherein the protection FET is formed on an anode side of the SSLS according to one embodiment.

FIG. 5 shows a schematic of a SSLS 56 with an integrated protection FET 58 formed on the anode side of the SSLS according to one embodiment. In one embodiment, the FET 58 can be formed over the p-type semiconductor layer 16 of the SSLS 56. The FET 58 comprises a gate electrode 20, a source electrode 22 and a drain electrode 60. A dielectric layer 50 can isolate the FET 58 from the p-type semiconductor layer 16. In one embodiment, the dielectric layer 50 isolates the gate electrode 20, the drain electrode 60 and a portion of the source electrode 22 from the p-type semiconductor layer 16. As shown in FIG. 5, an anode electrode 62 and the adjoining dielectric layer 50 are formed over a surface 63 of the p-type semiconductor layer 16. Both the anode electrode 62 and the dielectric layer 50 extend to opposing ends of the surface 63 of the p-type semiconductor layer 16.

As shown in FIG. 5, the source electrode 22 can be formed over a portion of both the anode electrode 62 and the dielectric layer 50 to form a connection therewith, while the gate electrode 20 can be formed over a portion of the source electrode 22. The gate electrode 20 can extend along the portion of the source electrode 22 and wrap around a side of the source electrode 22 to contact a first portion 65 of a surface 67 of the dielectric layer 50. The drain electrode 60 can be spaced apart from the source electrode 22 and the gate electrode 20 to contact a second portion 69 of the surface 63 of the p-type semiconductor layer 16. Although not shown in FIG. 5, the source electrode 22 and/or drain electrode 60 can be connected to a power supply or other external circuit elements. For example, in one embodiment, the source electrode 22 can be connected to a negative terminal of the power supply. In one embodiment, the drain electrode 60 can have a connection to a positive terminal of a power supply.

The SSLS 56 and the protection FET 58 can be formed on a substrate/buffer 64 which can include a cathode electrode 66 located on an opposing side of the n-type semiconductor layer 14. The substrate/buffer 64 is illustrated in FIG. 5 as one element, however, it is understood that the substrate and buffer can comprise separate elements. In one embodiment, the SSLS 56 and the FET 58 can be formed on the buffer layer, which can be formed on the substrate. In one embodiment, the substrate can include a conductive substrate. Examples of a conductive substrate can include, but are not limited to, doped silicon, doped SiC, doped GaAs, doped GaN, and other semiconductor materials. In the schematic depicted in FIG. 5, the configuration of the SSLS 56 and the FET 58 including the anode electrode 62 and the cathode electrode 66 can form a vertical structure. Advantages and benefits to this configuration include: achieving a small total device size as the FET does not consume any space in the lateral direction; and elimination of the need to deposit a separate layer forming the FET channel.

Figure 6:
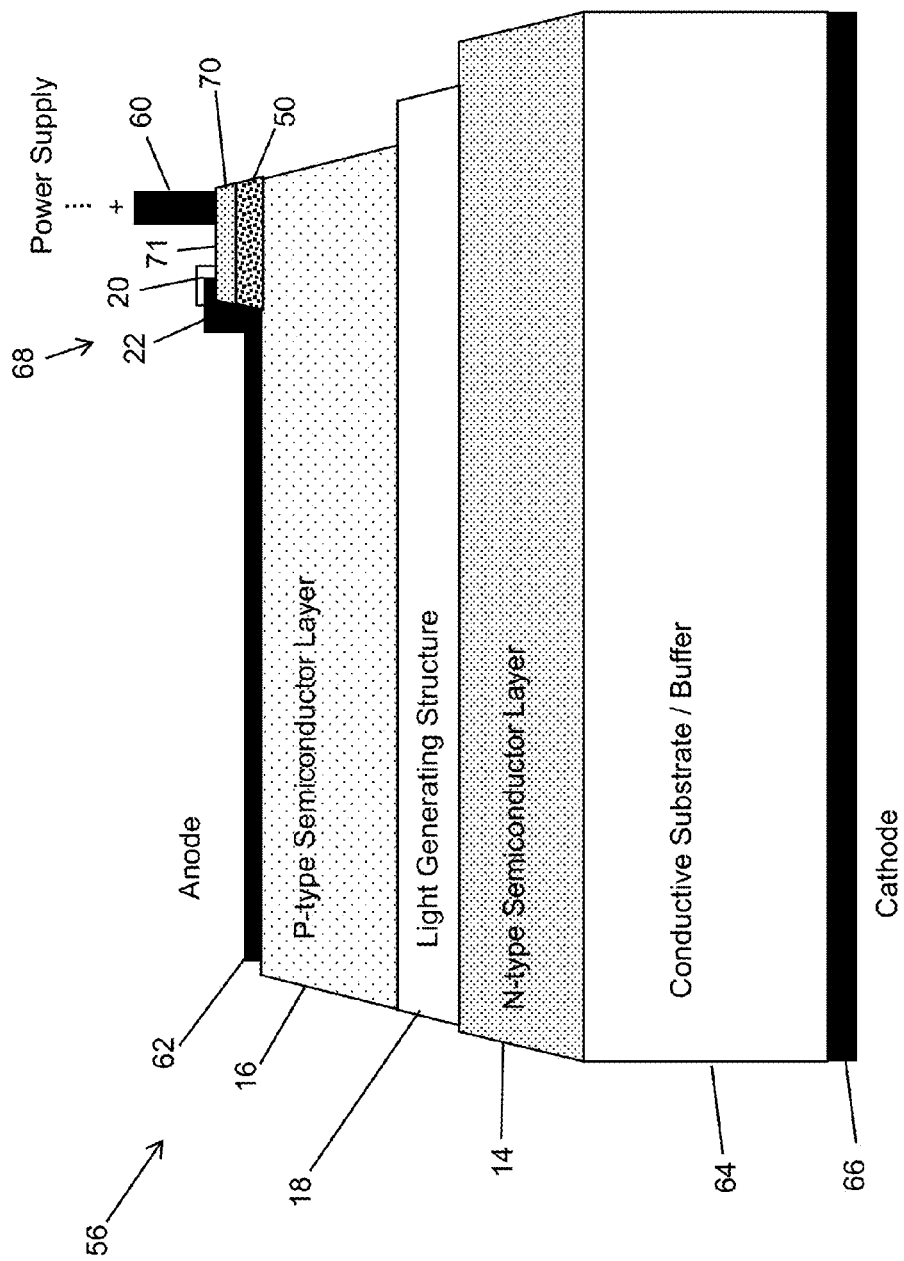
FIG. 6 shows a schematic of a SSLS with an integrated protection FET formed over a dielectric layer located on the anode side of the SSLS according to one embodiment.

FIG. 6 shows a schematic of another vertical structure. In particular, FIG. 6 illustrates the SSLS 56 with an integrated protection FET 68 formed over two layers 50, 70 located on the anode side of the SSLS 56 according to one embodiment. In this embodiment, a FET channel layer 70 is formed over the dielectric layer 50. The FET channel layer 70 can include any suitable semiconductor material for forming a channel. As shown, in FIG. 6, the source electrode 22 can be formed over a portion of both the anode electrode 62 and the FET channel layer 70. The source electrode 22 can extend upwards from the anode electrode 62 to along a side surface of the FET channel layer 70 and wrap around to extend along a first portion of a surface 71 of the FET channel layer 70. The gate electrode 20 can be formed over a portion of the source electrode 22, extending along this portion of the source electrode, and wrapping around a side of the source electrode 22 to contact a second portion of the surface 71 of the FET channel layer 70. Like FIG. 5, the drain electrode 60 can be spaced apart from the source electrode 22 and the gate electrode 20, but it contacts a third portion of the surface 71 of the FET channel layer 70. In addition, the drain electrode 60 can have a connection to a positive terminal of a power supply. An advantage or benefit to this configuration depicted in FIG. 6 can include the ability to deposit an additional n-type layer 70 to form the FET channel and therefore to achieve a lower on-resistance and higher mobility as compared to the p-type channel of FIG. 5.

Figure 7:
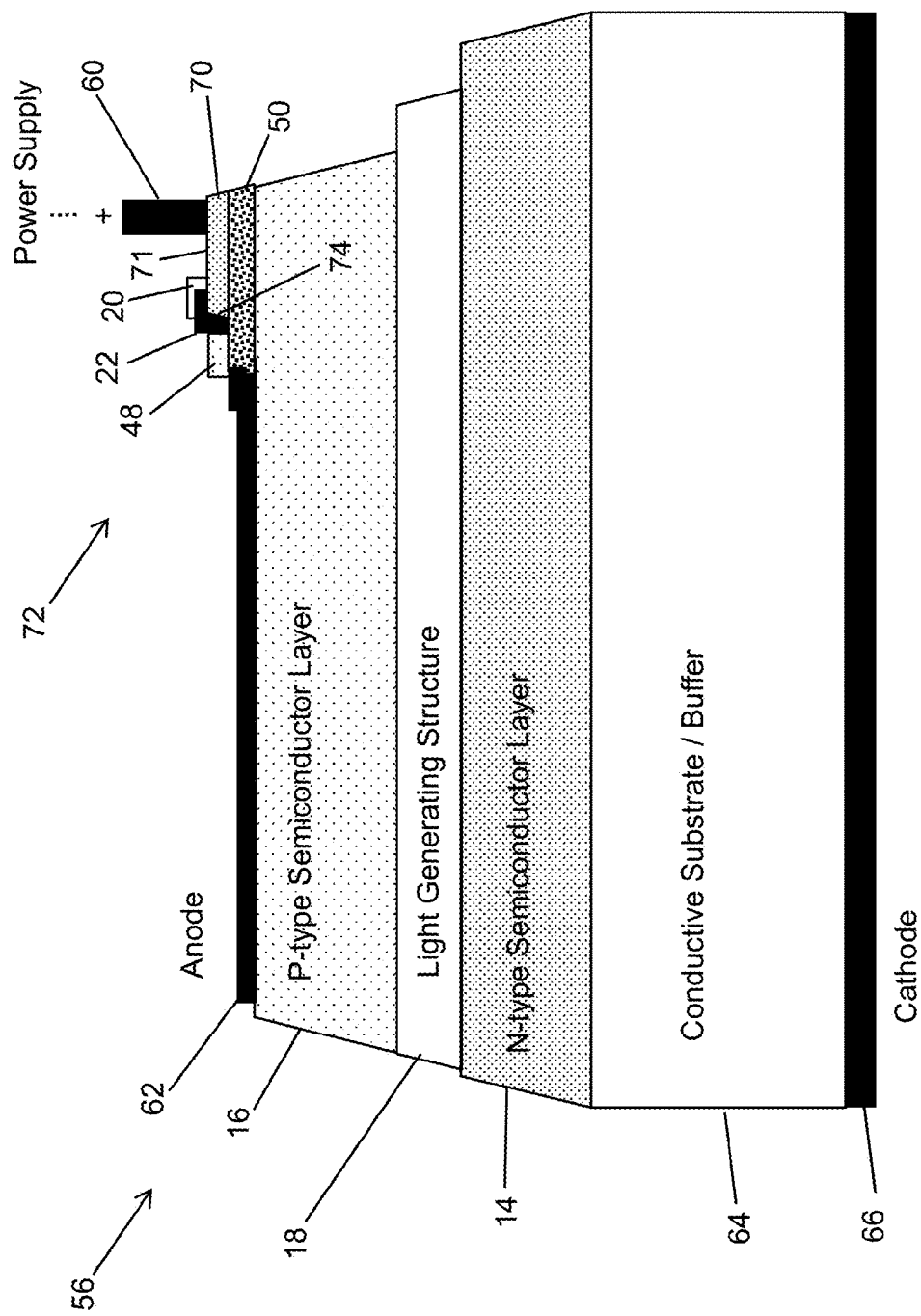
FIG. 7 shows a schematic of a SSLS with an integrated protection FET located on the anode side of the SSLS and connected in series with a fuse element according to one embodiment.

FIG. 7 shows a schematic of the SSLS 58 with an integrated protection FET 72 located on the anode side of the SSLS and connected in series with a fuse element 48 according to one embodiment and isolated by two dielectric layers. In this embodiment, the FET channel layer 70 and the fuse element 48 can both be formed over the dielectric layer 50. As shown in FIG. 7, the source electrode 22 can be formed between the fuse element 48 and a side surface 74 of the FET channel layer 70. In one embodiment, the source electrode 22 can extend upwards against the side surface 74 of the FET channel layer 70 and wrap around to extend along a first portion of the surface 71 of the FET channel layer 70. The gate electrode 20 can be formed over the source electrode 22. In one embodiment, the gate electrode 20 can extend along a surface of the source electrode, wrapping around a side to contact a second portion of the surface 71 of the FET channel layer 70. In addition, the drain electrode 60 can be spaced apart from the source electrode 22 and the gate electrode 20 to contact a third portion of the surface 71 of the FET channel layer 70. In one embodiment, the drain electrode 60 can have a connection to a first terminal of a power supply. An advantage or benefit to this vertical structure configuration depicted in FIG. 7 includes a separately formed fuse element, which allows for independent control of the critical current causing fuse melting.

Figure 8:
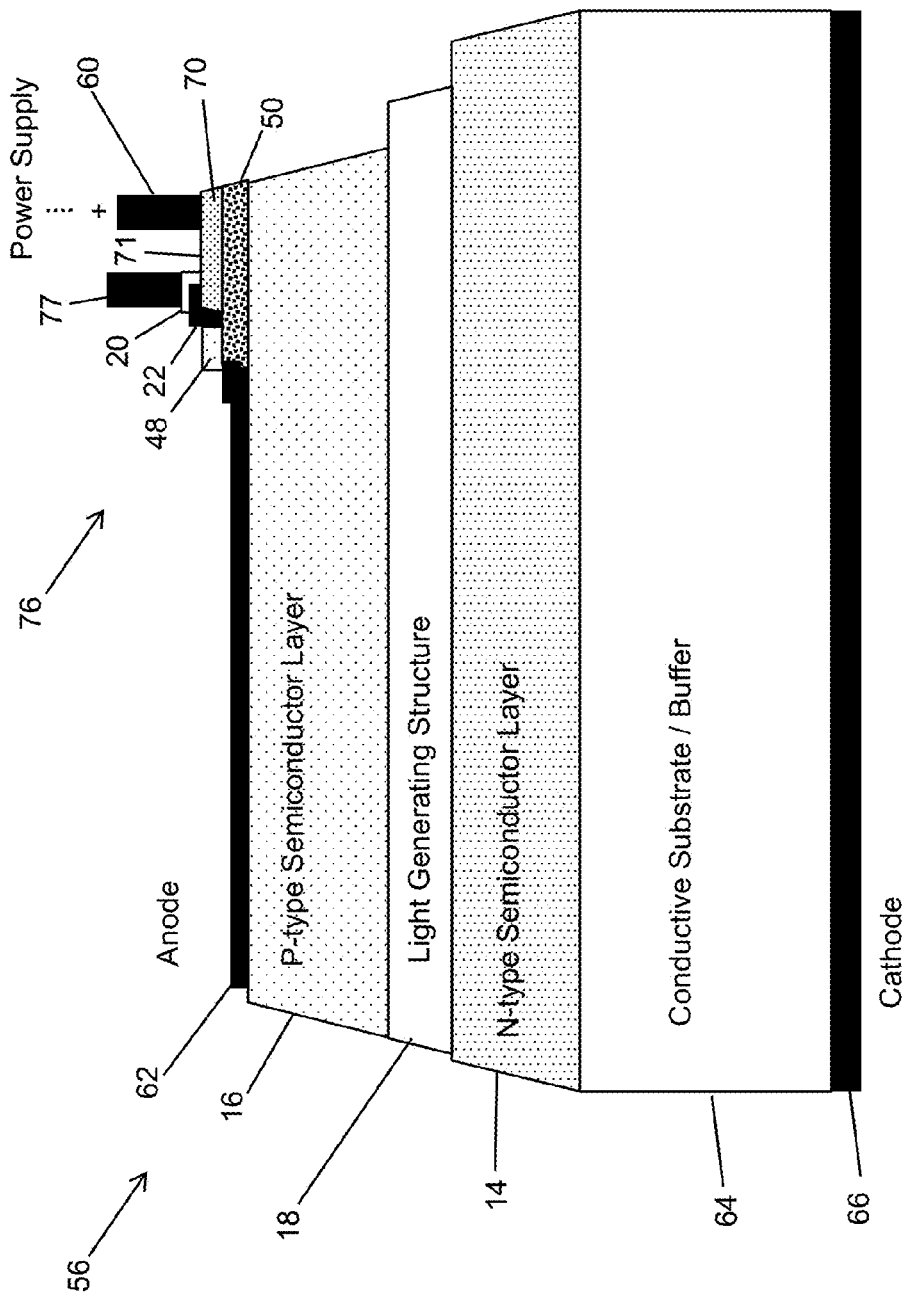
FIG. 8 shows a schematic of a SSLS with an integrated protection FET having a gate contact terminated with an additional electrode allowing it to be connected to a controlling voltage according to one embodiment.

FIG. 8 shows another vertical structure in which the SSLS 56 and an integrated protection FET 76 are formed on the conductive substrate 64 according to one embodiment. FIG.

8 is similar to FIG. 7, except that the schematic in this figure shows the FET 76 having the gate electrode 20 terminated with an additional contact 77 allowing the gate electrode 20 to be connected to a controlling voltage. In one embodiment, this gate contact 77 emanating from the gate electrode 20 can be coupled to another terminal of the power supply. In this manner, the contact from the gate electrode 20 can be coupled to a positive terminal of the power supply, while the contact from the drain electrode 60 can be coupled to a negative terminal of the power supply. With this configuration, an additional tuning of the FET saturation current using the voltage applied to the gate can be achieved.

Figure 9:
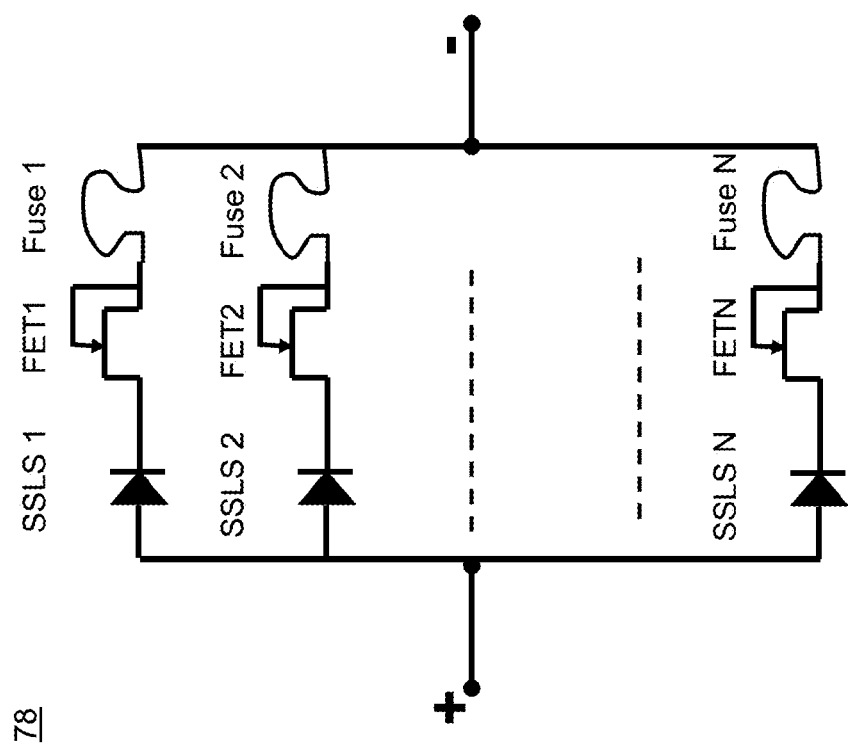
FIG. 9 shows a schematic of a system formed from a set of SSLSs and a set of protecting elements, including the protection FETS and fuse elements, that can be connected in parallel to form a system according to one embodiment.

FIG. 9 shows yet another embodiment of the invention wherein multiple SSLSs (SSLS1, SSLS2, ... SSLS N) and the corresponding protection elements including protection FETs (FET1, FET2, ... FETN) and fuse elements (Fuse 1, Fuse 2, ... Fuse N) are connected in parallel to form a system 78 according to one embodiment. Each of the SSLSs (SSLS1, SSLS2, ... SSLS N) can include an n-type semiconductor layer, a p-type semiconductor layer and a light generating structure formed between the n-type semiconductor layer and the p-type semiconductor layer. These SSLSs can include any of the aforementioned layouts and materials that can be used for the various layers described herein. Likewise, the protection FETs (FET1, FET2, ... FETN) and the fuse elements (Fuse 1, Fuse 2, ... Fuse N) can take the form of any of the aforementioned arrangements as well as comprise any of the materials described herein. Although all of the SSLSs, FETs and fuse elements are depicted in FIG. 9 as connected in parallel, it is understood that not all of these components have to be in parallel. For example, it is possible to have only some of the SSLSs, FETs and fuse elements connected in parallel. Similarly, it is possible to have one or more of the SSLSs include only a FET connected in series, without a fuse element as shown and described herein.

A power supply can be connected to the parallel coupled SSLSs (SSLS1, SSLS2, ... SSLS N), protection FETs (FET1, FET2, ... FETN) and fuse elements (Fuse 1, Fuse 2, ... Fuse N). Although the power supply is not expressly illustrated, the positive and negative terminals of the power supply are each shown coupled to a node. For example, as shown in FIG. 9, the positive terminal can be coupled to a node that connects with each of the SSLSs and the negative terminal can be coupled to a node that connects with each of the fuse elements. It is understood that this arrangement of the terminals of the power supply is only representative of one configuration and is not meant to limit the various embodiments of the present invention.

The system 78 is suitable for a multitude of applications. For example, the system 78 can be used in a multi-element light emitting system such as a lamp assembly. In one embodiment, in the system 78, the SSLSs can comprise LEDs. In another embodiment, the SSLSs can comprise lasers. In still another embodiment, the SSLSs can comprise a combination of LEDs and lasers.

Figure 10:
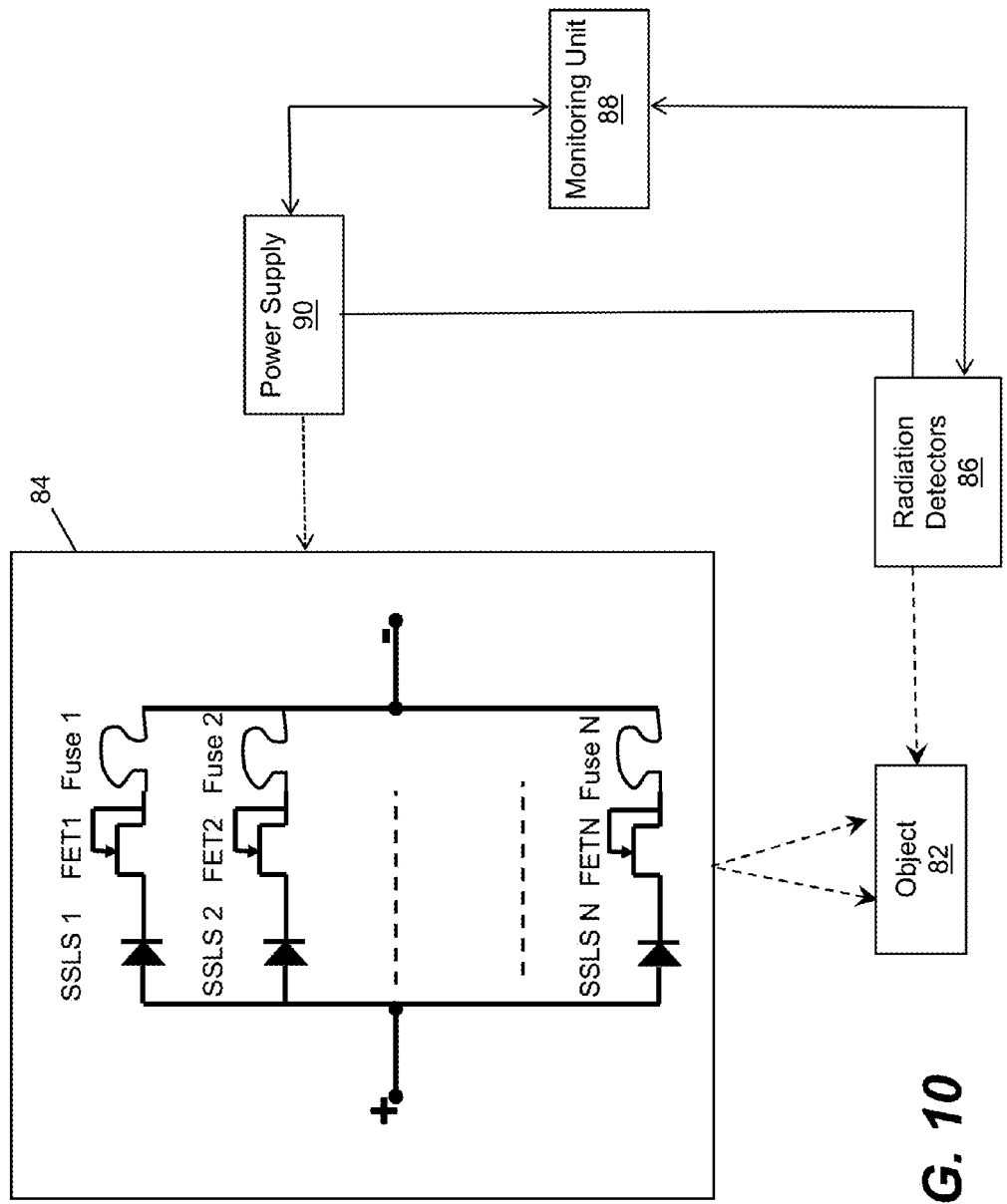
FIG. 10 shows a schematic of a system in which a set of SSLSs, protection FETs and fuse elements are used in an ultraviolet radiation application environment according to an embodiment.

FIG. 10 shows a schematic of a system 80 in which one or more SSLSs, protection FETs and fuse elements are used in an ultraviolet radiation application environment according to an embodiment. In this embodiment, the system 80 includes an object 82 that is to receive radiation. The object can include any of a multitude of objects and components of varying sizes and shapes. Examples, can include, but are not limited to, medical instruments, medical equipment, appliances, a fluid, a liquid, food, etc.

A radiation source 84 including one or more light sources can direct radiation onto the object 82. In one embodiment, the radiation source 84 can include set of solid-state lighting structures (SSLSs), each including an n-type semiconductor layer, a p-type semiconductor layer and a light generating structure formed between the n-type semiconductor layer and the p-type semiconductor layer. The radiation source 84 can further include a set of FETs, each monolithically connected in series with one of the SSLSs. The radiation source 84 can also include a set of fuse elements (e.g., Fuse 1, Fuse 2, ... Fuse N) connected in series with one of the SSLS/FET pairs. In one embodiment, each fuse element can be connected to one of the FETS connected in series with one of the SSLSs. In one embodiment, each coupled SSLS, FET and fuse element can be connected in parallel to other similarly coupled SSLSs, FETs and fuse elements.

The system 80 of FIG. 10 can also include a set of radiation detectors 86, each configured to detect an amount of radiation directed to the object 82 by the radiation source 84. Each radiation detector 86 can be configured to detect an intensity of radiation directed at the object 82 and generate signals representative thereof.

The system 80 of FIG. 10 can further include a monitoring unit 88 configured to receive the intensity of radiation signals detected by the set of radiation detectors 86 and monitor the intensity of radiation directed at the object 82. The monitoring unit 88 can also be configured to control an amount of radiation generated from the radiation source 84 towards the object 82 as a function of the intensity of radiation. The monitoring unit 88 can comprise, for example, one or more computing devices, which includes programming and/or customized hardware to implement the monitoring and/or control functions described herein. Alternatively, the monitoring unit 88 can comprise a closed loop circuit implementing a feedback control loop in which the outputs of one or more sensing devices are used as inputs to control the operation of one or more other devices.

FIG. 10 also shows that the system 80 can include a power supply 90 that powers the radiation source 84 and the radiation detectors 86. In one embodiment, the power supply 90 can provide feedback to the monitoring unit 88 pertaining to the amount of power supplied to the radiation source 84 and the radiation detectors 86. The monitoring unit 88 can be configured to control the operation of the power supply 90 provided to the radiation source 84 and the radiation detectors 86 as a function of the intensity of radiation. In this manner, in one embodiment, the monitoring unit 88 can ensure that the power supply 90 maintains the set of SSLSs in the radiation source 84 in a desired operating regime. It is understood that the embodiment depicted in FIG. 10 is illustrative of only one approach in which the SSLSs, protection FETs, and fuse elements can be incorporated in a system to direct radiation at an object and is not meant to be limiting.

Figure 11:
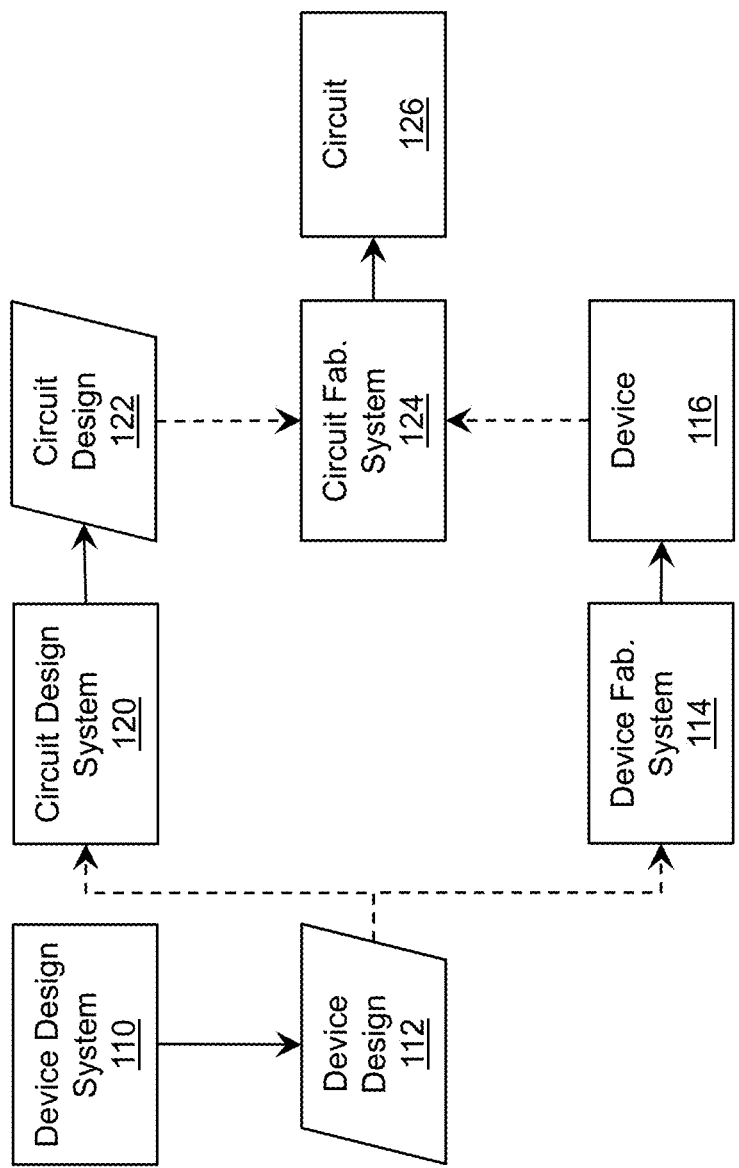
FIG. 11 shows an illustrative flow diagram for fabricating a circuit that comprises a SSLS with an integrated protection FET according to one of the various embodiments described herein.

In one embodiment, the invention provides a method of designing and/or fabricating a circuit that includes one or more of the devices designed and fabricated as described herein. To this extent, FIG. 11 shows an illustrative flow diagram for fabricating a circuit 126 according to an embodiment. Initially, a user can utilize a device design system 110 to generate a device design 112 for a semiconductor device as described herein. The device design 112 can comprise program code, which can be used by a device fabrication system 114 to generate a set of physical devices 116 according to the features defined by the device design 112. Similarly, the device design 112 can be provided to a circuit design system 120 (e.g., as an available component for use in circuits), which a user can utilize to generate a circuit design 122 (e.g., by connecting one or more inputs and outputs to various devices included in a circuit). The circuit design 122 can comprise program code that includes a device designed as described herein. In any event, the circuit design 122 and/or one or more physical devices 116 can be provided to a circuit fabrication system 124, which can generate a physical circuit 126 according to the circuit design 122. The physical circuit 126 can include one or more devices 116 designed as described herein.

In another embodiment, the invention provides a device design system 110 for designing and/or a device fabrication system 114 for fabricating a semiconductor device 116 as described herein. In this case, the system 110, 114 can comprise a general purpose computing device, which is programmed to implement a method of designing and/or fabricating the semiconductor device 116 as described herein. Similarly, an embodiment of the invention provides a circuit design system 120 for designing and/or a circuit fabrication system 124 for fabricating a circuit 126 that includes at least one device 116 designed and/or fabricated as described herein. In this case, the system 120, 124 can comprise a general purpose computing device, which is programmed to implement a method of designing and/or fabricating the circuit 126 including at least one semiconductor device 116 as described herein. In either case, the corresponding fabrication system 114, 124, can include a robotic arm and/or electromagnet, which can be utilized as part of the fabrication process as described herein.

In still another embodiment, the invention provides a computer program fixed in at least one computer-readable medium, which when executed, enables a computer system to implement a method of designing and/or fabricating a semiconductor device as described herein. For example, the computer program can enable the device design system 110 to generate the device design 112 as described herein. To this extent, the computer-readable medium includes program code, which implements some or all of a process described herein when executed by the computer system. It is understood that the term "computer-readable medium" comprises one or more of any type of tangible medium of expression, now known or later developed, from which a stored copy of the program code can be perceived, reproduced, or otherwise communicated by a computing device.

In another embodiment, the invention provides a method of providing a copy of program code, which implements some or all of a process described herein when executed by a computer system. In this case, a computer system can process a copy of the program code to generate and transmit, for reception at a second, distinct location, a set of data signals that has one or more of its characteristics set and/or changed in such a manner as to encode a copy of the program code in the set of data signals. Similarly, an embodiment of the invention provides a method of acquiring a copy of program code that implements some or all of a process described herein, which includes a computer system receiving the set of data signals described herein, and translating the set of data signals into a copy of the computer program fixed in at least one computer-readable medium. In either case, the set of data signals can be transmitted/received using any type of communications link.

In still another embodiment, the invention provides a method of generating a device design system 110 for designing and/or a device fabrication system 114 for fabricating a semiconductor device as described herein. In this case, a computer system can be obtained (e.g., created, maintained, made available, etc.) and one or more components for performing a process described herein can be obtained (e.g., created, purchased, used, modified, etc.) and deployed to the computer system. To this extent, the deployment can comprise one or more of: (1) installing program code on a computing device; (2) adding one or more computing and/or I/O devices to the computer system; (3) incorporating and/or modifying the computer system to enable it to perform a process described herein; and/or the like.

The foregoing description of various aspects of the invention has been presented for purposes of illustration and description. It is not intended to be exhaustive or to limit the invention to the precise form disclosed, and obviously, many modifications and variations are possible. Such modifications and variations that may be apparent to an individual in the art are included within the scope of the invention as defined by the accompanying claims.

What is claimed is:

1. A device, comprising:
a solid-state lighting structure (SSLS) including a n-type semiconductor layer, a p-type semiconductor layer and a light generating structure formed between the n-type semiconductor layer and the p-type semiconductor layer;
a field-effect transistor (FET) monolithically connected in series with the SSLS, wherein the FET is formed over one of: the n-type semiconductor layer or the p-type semiconductor layer; and
wherein the SSLS comprises an SSLS static resistance and the FET comprises a FET resistance, wherein the FET resistance in a linear regime of operation is less than the SSLS static resistance under normal operating current.

2. The device of claim 1, wherein the FET is integrated with the n-type semiconductor layer.

3. The device of claim 2, wherein the n-type semiconductor layer includes a first horizontally extending region, a second horizontally extending region, a recessed region formed between the first horizontally extending region and the second horizontally extending region, and an elevated region extending upward from the second horizontally extending region.

4. The device of claim 3, wherein the FET comprises a gate electrode and a source electrode, the gate electrode formed on a portion of a surface of the recessed region, the gate electrode extending along the surface of the recessed region up against a sidewall forming the recessed region, the gate electrode extending upward along the sidewall of the recessed region onto a surface of the second horizontally extending region, the source electrode extending along the surface of the second horizontally extending region up against a sidewall of the elevated region, the source electrode extending upward along the sidewall of the elevated region onto a surface of the elevated region, wherein the gate electrode connects with the source electrode on the surface of the second horizontally extending region.

5. The device of claim 3, wherein the FET comprises a source electrode, the source electrode formed on a portion of a surface of the recessed region, the source electrode extending along the surface of the recessed region up against a sidewall forming the recessed region, the source electrode extending upward along the sidewall of the recessed region onto a surface of the second horizontally extending region, the source electrode extending along the surface of the second horizontally extending region up against a sidewall of the elevated region, the source electrode extending upward along the sidewall of the elevated region onto a surface of the elevated region.

6. The device of claim 3, further comprising a dielectric layer and a fuse element, the dielectric layer formed on the second horizontally extending region, and the fuse element formed over the dielectric layer.

7. The device of claim 6, wherein the FET comprises a gate electrode and a source electrode, the gate electrode formed on a portion of a surface of the recessed region, the gate electrode extending along the surface of the recessed region up against a sidewall forming the recessed region, the gate electrode extending upward along the sidewall of the recessed region over a surface of the second horizontally extending region, the source electrode including a first region extending along a portion of the surface of the second horizontally extending region and a second region apart from the first region that extends upward along the sidewall of the elevated region onto a surface of the elevated region, wherein the gate electrode connects with the first region of the source electrode on the surface of the second horizontally extending region.

8. The device of claim 7, wherein the dielectric layer is formed along another portion of the surface of the second horizontally extending region, wherein a first end of the dielectric layer contacts the source electrode, and an opposing second end contacts the sidewall of the elevated region, wherein the second region of the source contact that contacts the sidewall of the elevated region extends upward along the sidewall of the elevated region, and contacts a surface of the dielectric layer near a bottom portion of the elevated region.

9. The device of claim 6, wherein the fuse element is formed on the dielectric layer and is between the first and second region of the source contact.

10. The device of claim 6, wherein the fuse element is configured to undergo a meltdown in response to an operating current of the SSLS attaining a saturation current of the FET, the meltdown of the fuse element leading to a disconnection of the SSLS.

11. The device of claim 1, wherein a saturation current of the FET in a saturation regime of operation is greater than the normal operating current of the SSLS and less than a predetermined protection threshold specified to protect the SSLS and the FET.

12. The device of claim 1, wherein the FET is integrated with the p-type semiconductor layer.

13. The device of claim 12, further comprising an anode electrode and an adjoining dielectric layer formed over a surface of the p-type semiconductor layer and a cathode electrode formed over the n-type semiconductor layer.

14. The device of claim 13, wherein the FET comprises a source electrode formed over a portion of both the anode electrode and the dielectric layer, a gate electrode formed over a portion of the source electrode, the gate electrode extending along the portion of the source electrode, wrapping around a side of the source electrode to contact a first portion of a surface of the dielectric layer, and a drain electrode spaced apart from the source electrode and the gate electrode that contacts a second portion of the surface of the dielectric layer and has a connection to terminal of a power supply.

15. The device of claim 13, further comprising a FET channel layer formed over the dielectric layer, wherein the FET comprises a source electrode formed over a portion of both the anode electrode and the FET channel layer, wherein the source electrode extends upward from the anode electrode along a side surface of the FET channel layer and wraps around to extend along a first portion of a surface of the FET channel layer, a gate electrode formed over a portion of the source electrode, the gate electrode extending along the portion of the source electrode, wrapping around a side of the source electrode to contact a second portion of the surface of the FET channel layer, and a drain electrode spaced apart from the source electrode and the gate electrode that contacts a third portion of the surface of the FET channel layer, the drain electrode having a connection to a terminal of a power supply.

16. The device of claim 13, further comprising a FET channel layer and a fuse element both formed over the dielectric layer, wherein the FET comprises a source electrode that is formed between the fuse element and a side surface of the FET channel layer, the source electrode extending upwards against the side surface of the FET channel layer and wrapping around to extend along a first portion of a surface of the FET channel layer, a gate electrode formed over the source electrode, the gate electrode extending along a surface of the source electrode, wrapping around a side to contact a second portion of the surface of the FET channel layer, and a drain electrode spaced apart from the source electrode and the gate electrode that contacts a third portion of the top surface of the FET channel layer and has a connection to a first terminal of a power supply.

17. The device of claim 16, wherein the gate electrode has a connection to a second terminal of the power supply.

18. A device, comprising:
a plurality of light emitting circuits connected in parallel, each of the plurality of light emitting circuits including:
a solid-state lighting structure (SSLS), including an n-type semiconductor layer, a p-type semiconductor layer and a light generating structure formed between the n-type semiconductor layer and the p-type semiconductor layer;
a field-effect transistor (FET) monolithically connected in series with the SSLS; and
a fuse element connected in series to the FET.

19. The device of claim 18, wherein, for at least one of the plurality of light emitting circuits, the SSLS comprises an SSLS static resistance and the FET comprises a FET resistance, wherein the FET resistance in a linear regime of operation is less than the SSLS static resistance under normal operating current.

20. A method, comprising:
fabricating a solid state light source (SSLS) with integrated short-circuit protection, wherein the SSLS with integrated short-circuit protection comprises:
a solid-state lighting structure (SSLS) including an n-type semiconductor layer, a p-type semiconductor layer and a light generating structure formed between the n-type semiconductor layer and the p-type semiconductor layer;
a field-effect transistor (FET) monolithically connected in series with the SSLS, wherein the FET is formed over one of: the n-type semiconductor layer or the p-type semiconductor layer; and
wherein the SSLS comprises an SSLS static resistance and the FET comprises a FET resistance, wherein the FET resistance in a linear regime of operation is less than the SSLS static resistance under normal operating current.

* * * * *